(12) United States Patent
Ohashi et al.

(10) Patent No.: US 11,003,078 B2
(45) Date of Patent: May 11, 2021

(54) COMPOSITIONS FOR FORMING A PROTECTIVE FILM AGAINST BASIC AQUEOUS HYDROGEN PEROXIDE SOLUTION, AND PATTERN FORMATION METHOD

(71) Applicant: NISSAN CHEMICAL CORPORATION, Tokyo (JP)

(72) Inventors: Tomoya Ohashi, Toyama (JP); Hiroto Ogata, Toyama (JP); Yuto Hashimoto, Toyama (JP); Yuki Usui, Toyama (JP); Yasushi Sakaida, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 76 days.

(21) Appl. No.: 16/098,379

(22) PCT Filed: Apr. 21, 2017

(86) PCT No.: PCT/JP2017/016043
§ 371 (c)(1),
(2) Date: Nov. 1, 2018

(87) PCT Pub. No.: WO2017/191767
PCT Pub. Date: Nov. 9, 2017

(65) Prior Publication Data
US 2019/0163064 A1 May 30, 2019

(30) Foreign Application Priority Data

May 2, 2016 (JP) .............................. JP2016-092727
Oct. 19, 2016 (JP) .............................. JP2016-205489

(51) Int. Cl.
| | | |
|---|---|---|
| *H01L 29/08* | (2006.01) | |
| *G03F 7/11* | (2006.01) | |
| *H01L 21/308* | (2006.01) | |
| *G03F 7/09* | (2006.01) | |
| *C08G 18/40* | (2006.01) | |
| *C08G 18/48* | (2006.01) | |
| *C08G 18/62* | (2006.01) | |
| *C09D 175/04* | (2006.01) | |

(Continued)

(52) U.S. Cl.
CPC .............. *G03F 7/11* (2013.01); *C08G 18/4063* (2013.01); *C08G 18/48* (2013.01); *C08G 18/62* (2013.01); *C09D 175/04* (2013.01); *G03F 7/094* (2013.01); *G03F 7/162* (2013.01); *G03F 7/168* (2013.01); *G03F 7/20* (2013.01); *G03F 7/322* (2013.01); *H01L 21/0274* (2013.01); *H01L 21/308* (2013.01); *H01L 21/3081* (2013.01); *H01L 21/30604* (2013.01); *H01L 21/32134* (2013.01); *H01L 21/32139* (2013.01)

(58) Field of Classification Search
CPC ... G03F 7/11; G03F 7/26; G03F 7/094; G03F 7/162; G03F 7/168; G03F 7/20; G03F 7/322; C09D 175/04; C09D 175/14; C08G 18/8048; C08G 18/711; C08G 18/4063; C08G 18/48; C08G 18/62; C08G 18/6204; H01L 21/306; H01L 21/3081; H01L 21/0274; H01L 21/30604; H01L 21/308; H01L 21/32134; H01L 21/32139
See application file for complete search history.

(56) References Cited

U.S. PATENT DOCUMENTS

| | | | | |
|---|---|---|---|---|
| 6,306,226 | B1* | 10/2001 | Iino .......................... | B05D 7/51 148/247 |
| 2012/0058641 | A1* | 3/2012 | Raman ...................... | C09G 1/02 438/692 |
| 2020/0183282 | A1* | 6/2020 | Hashimoto ............ | C08G 59/62 |

FOREIGN PATENT DOCUMENTS

| | | |
|---|---|---|
| JP | 4145972 B2 | 9/2008 |
| JP | 2014-192187 A | 10/2014 |

(Continued)

OTHER PUBLICATIONS

Jul. 11, 2017 International Search Report issued in International Patent Application PCT/JP2017/016043.

(Continued)

*Primary Examiner* — Caleb E Henry
(74) *Attorney, Agent, or Firm* — Oliff PLC

(57) ABSTRACT

A composition for forming a protective film against basic aqueous hydrogen peroxide solution, including a crosslinker having, in one molecule, two or more groups at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate, a compound having a group of Formula (1):

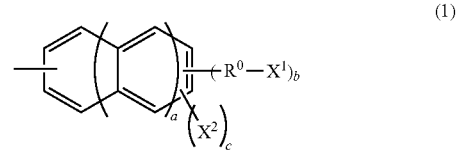

(1)

(wherein $X^1$ is a substituent reacting with the crosslinker, $R^0$ is a direct bond or a $C_{1-2}$ alkylene group, $X^2$ is a $C_{1-2}$ alkyl group, $C_{1-2}$ alkoxy group, or fluoro group, a is an integer of 0-2, b is an integer of 1-3, c is an integer of 0-4, and b and c satisfy a relational expression of $1 \leq (b+c) \leq 5$) on a side chain or a terminal and having a weight average molecular weight of 800 or more, and an organic solvent.

10 Claims, No Drawings

(51) Int. Cl.
*G03F 7/16* (2006.01)
*G03F 7/20* (2006.01)
*G03F 7/32* (2006.01)
*H01L 21/027* (2006.01)
*H01L 21/306* (2006.01)
*H01L 21/3213* (2006.01)

(56) References Cited

FOREIGN PATENT DOCUMENTS

| | | | | |
|---|---|---|---|---|
| JP | 201699374 | * | 11/2014 | ............ G03F 7/004 |
| JP | 2016-177262 A | | 10/2016 | |
| JP | 2016-185999 A | | 10/2016 | |
| JP | 2017-107185 A | | 6/2017 | |
| WO | 2004/061526 A1 | | 7/2004 | |
| WO | 2005/013601 A1 | | 2/2005 | |
| WO | 2006/077748 A1 | | 7/2006 | |
| WO | 2008/072624 A1 | | 6/2008 | |
| WO | 2014/007079 A1 | | 1/2014 | |
| WO | 2015/030060 A1 | | 3/2015 | |

OTHER PUBLICATIONS

Jul. 11, 2017 Written Opinion issued in International Patent Application PCT/JP2017/016043.

* cited by examiner

COMPOSITIONS FOR FORMING A PROTECTIVE FILM AGAINST BASIC AQUEOUS HYDROGEN PEROXIDE SOLUTION, AND PATTERN FORMATION METHOD

TECHNICAL FIELD

The present invention relates to a composition for forming a protective film having excellent resistance to basic aqueous hydrogen peroxide solution in a lithography process. In addition, the present invention relates to a method for forming a pattern using the protective film.

BACKGROUND ART

A lithography process in which a resist underlayer film is provided between a substrate and a resist film formed on the substrate and a desired resist pattern is formed has been known. However, a conventional resist underlayer film, for example, a resist underlayer film formed from a composition containing an aminoplast-based crosslinker that is described in Patent Document 1 is less resistance to basic aqueous hydrogen peroxide solution. Therefore, such a resist underlayer film cannot be used as a mask in an etching process using the basic aqueous hydrogen peroxide solution.

Patent Document 2 describes an underlayer film-forming composition for lithography containing a compound having a protected carboxyl group, a compound having a group capable of reacting with a carboxyl group, and a solvent, or an underlayer film-forming composition for lithography containing a compound having a group capable of reacting with a carboxyl group and a protected carboxyl group and a solvent. The compositions do not contain an aminoplast-based crosslinker as an essential component. However, Patent Document 2 does not describe or suggest the resistance to basic aqueous hydrogen peroxide solution of a resist underlayer film formed from the composition.

Patent Document 3 describes a pattern forming method using a resist underlayer film having resistance to basic aqueous hydrogen peroxide solution. A composition for forming the resist underlayer film contains a polymer having a weight average molecular weight of 1,000 to 100,000 and having an epoxy group, and a solvent.

PRIOR ART DOCUMENTS

Patent Documents

Patent Document 1: Japanese Patent No. 4145972
Patent Document 2: International publication WO2005/013601
Patent Document 3: International publication WO2015/030060

SUMMARY OF THE INVENTION

Problem to be Solved by the Invention

In recent years, a protective film having improved resistance to basic aqueous hydrogen peroxide solution as compared with a conventional protective film is increasingly required. An object of the present invention is to provide a novel composition for forming a protective film against basic aqueous hydrogen peroxide solution, and a method for forming a pattern using the protective film.

Means for Solving the Problems

The inventor of the present invention has found a combination of a specific crosslinker other than an aminoplast-based crosslinker with a compound having a substituent reacting with the specific crosslinker and having a weight average molecular weight of 800 or more. Thus, the inventor can achieve the aforementioned object. Specifically, a first aspect of the present invention is a composition for forming a protective film against a basic aqueous hydrogen peroxide solution, comprising a crosslinker having, in one molecule, two or more groups that are at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group, a compound having a group of the following Formula (1):

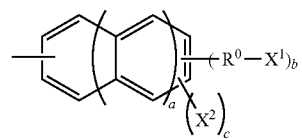

(1)

(wherein $X^1$ is a substituent reacting with the crosslinker, $R^0$ is a direct bond or a $C_{1-2}$ alkylene group, $X^2$ is a $C_{1-2}$ alkyl group, a $C_{1-2}$ alkoxy group, or fluoro group, a is an integer of 0 to 2, b is an integer of 1 to 3, when b is 2 or 3, groups of $-R^0-X^1$ may be different from each other, c is an integer of 0 to 4, when c is 2, 3, or 4, the groups of $X^2$ may be different from each other, and b and c satisfy a relational expression of $1 \leq (b+c) \leq 5$) on a side chain or a terminal and having a weight average molecular weight of 800 or more, and an organic solvent.

The composition for forming a protective film may contain a compound having a group of the following Formula (2):

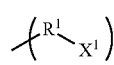

(2)

(wherein $R^1$ is a direct bond or a linear or branched alkylene group having a carbon atom number of 1 to 8, and $X^1$ is a substituent reacting with the crosslinker) on a side chain or a terminal and having a weight average molecular weight of 800 or more instead of the compound having the group of Formula (1) on a side chain or a terminal and having a weight average molecular weight of 800 or more.

The substituent $X^1$ reacting with the crosslinker is a group directly reacting with the crosslinker or a group including a group directly reacting with the crosslinker. The group directly reacting with the crosslinker may include a group having a protecting group and reacting with the crosslinker after the protecting group is removed.

The substituent $X^1$ reacting with the crosslinker is, for example, a group of the following Formula (3), (4), (5), (6), (7), (8), (9), (10), or (11):

(3)

  (4)

  (5)

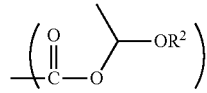  (6)

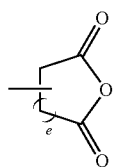  (7)

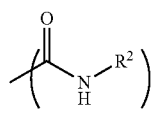  (8)

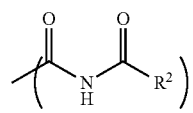  (9)

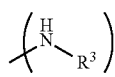  (10)

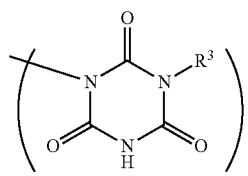  (11)

(wherein $R^2$ is a linear, branched, or cyclic alkyl group having a carbon atom number of 1 to 8, $R^3$ is a hydrogen atom or a linear, branched, or cyclic hydrocarbon group having a carbon atom number of 1 to 8, and e is 0 or 1).

The substituent $X^1$ reacting with the crosslinker is preferably the group of Formula (3), (5), or (6).

For example, the amount of the crosslinker to be added is an amount capable of sealing the substituent $X^1$ in an amount of 20% by mole to 150% by mole when the total amount of the substituent $X^1$ reacting with the crosslinker in the compound having a weight average molecular weight of 800 or more is made 100% by mole. It is preferable that the crosslinker have two or more glycidyl groups, terminal epoxy groups, or epoxycyclohexyl groups in one molecule.

For example, the blocked isocyanate group is a group of the following Formula (11) or (12):

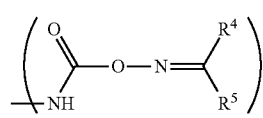  (11)

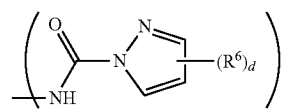  (12)

(wherein $R^4$ and $R^5$ are each independently a $C_{1-5}$ alkyl group, $R^6$ is a $C_{1-5}$ alkyl group, d is an integer of 1 to 3, and when d is 2 or 3, $C_{1-5}$ alkyl groups of $R^6$ may be different from each other).

The composition for forming a protective film of the present invention may further contain a crosslinking catalyst. The composition for forming a protective film of the present invention may further contain a surfactant.

A second aspect of the present invention is a method for forming a pattern comprising: forming a protective film on a semiconductor substrate optionally having an inorganic film on a surface thereof using the composition for forming a protective film against basic aqueous hydrogen peroxide solution according to the first aspect of the present invention; forming a resist pattern on the protective film; dry etching the protective film using the resist pattern as a mask to expose the surface of the inorganic film or the semiconductor substrate; and wet etching the inorganic film or the semiconductor substrate with a basic aqueous hydrogen peroxide solution using the dry-etched protective film as a mask, followed by washing.

For example, the basic aqueous hydrogen peroxide solution contains ammonia, sodium hydroxide, potassium hydroxide, sodium cyanide, potassium cyanide, triethanol amine, or urea. When the basic aqueous hydrogen peroxide solution contains ammonia, the basic aqueous hydrogen peroxide solution is, for example, a mixture of 25% by mass to 30% by mass aqueous ammonia solution (A), 30% by mass to 36% by mass aqueous hydrogen peroxide solution (B), and water (C). The volume ratio (B)/(A) of the aqueous hydrogen peroxide solution (B) to the aqueous ammonia solution (A) is 0.1 to 20.0, and the volume ratio (C)/(A) of the water (C) to the aqueous ammonia solution (A) is 0.1 to 50.0.

Effects of the Invention

A protective film formed from the composition for forming a protective film of the present invention has resistance to basic aqueous hydrogen peroxide solution. In particular, a protective film formed from the composition for forming a protective film using a crosslinker having two or more glycidyl groups, terminal epoxy groups, or epoxycyclohexyl groups in one molecule has excellent resistance to the basic aqueous hydrogen peroxide solution. The protective film formed from the composition for forming a protective film of the present invention can be used as a mask in an etching process using the basic aqueous hydrogen peroxide solution and a washing process.

MODES FOR CARRYING OUT THE INVENTION

Hereinafter, components contained in the composition for forming a protective film of the present invention will be described in detail.

[Compound Having Weight Average Molecular Weight of 800 or More]

The composition for forming a protective film of the present invention contains a compound having a group of Formula (1) or Formula (2) on a side chain or a terminal and having a weight average molecular weight of 800 or more. The weight average molecular weight of the compound is a value obtained by gel permeation chromatography (GPC) using polystyrene as a standard sample. The upper limit value of the weight average molecular weight is, for example, 500,000. The compound having a weight average molecular weight of 800 or more is not limited to a polymer. The compound may be a mixture of one or two or more selected from the group consisting of a monomer, a dimer, a trimer, and an oligomer. The polymer may be a copolymer or a homopolymer.
Examples of the group of Formula (1) include groups of the following Formulae (1-1) to (1-111).
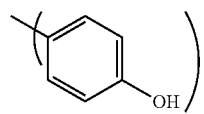
(1-1)
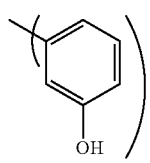
(1-2)
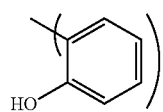
(1-3)
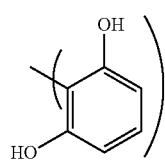
(1-4)
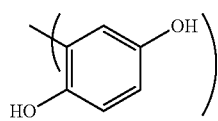
(1-5)
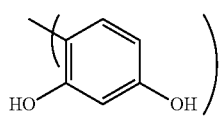
(1-6)
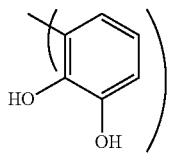
(1-7)
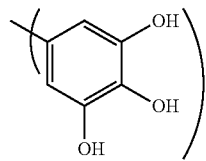
(1-8)
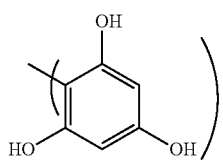
(1-9)
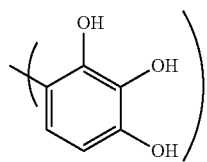
(1-10)
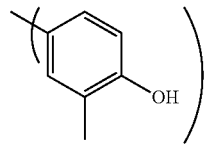
(1-11)
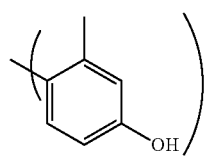
(1-12)
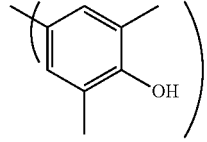
(1-13)
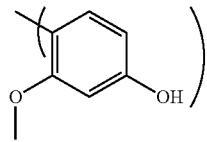
(1-14)
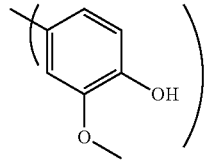
(1-15)
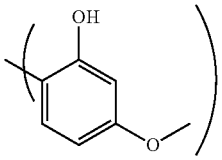
(1-16)
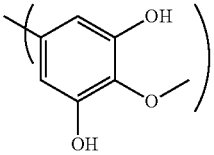
(1-17)
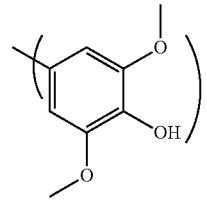
(1-18)

-continued
(1-19)
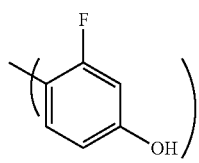
(1-20)
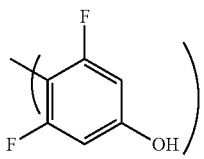
(1-21)
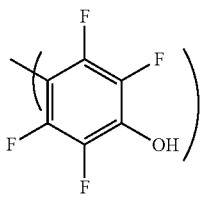
(1-22)
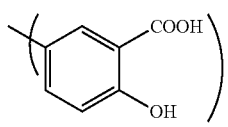
(1-23)
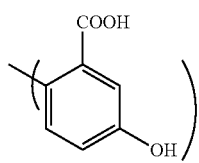
(1-24)
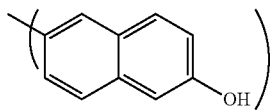
(1-25)
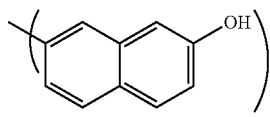
(1-26)
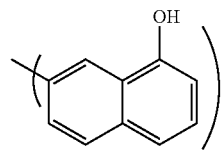
(1-27)
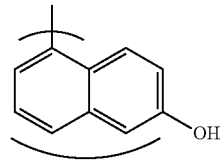
(1-28)
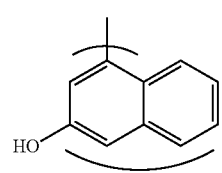
-continued
(1-29)
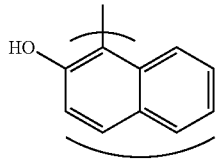
(1-30)
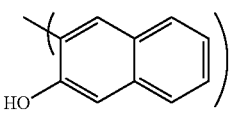
(1-31)
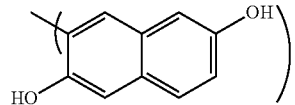
(1-32)
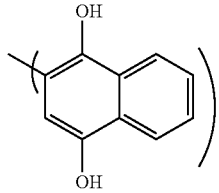
(1-33)
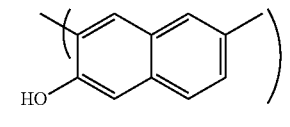
(1-34)
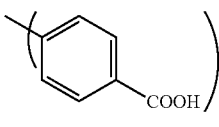
(1-35)
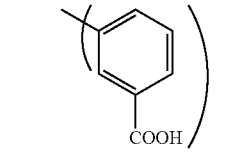
(1-36)
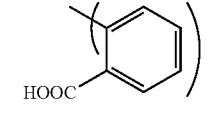
(1-37)
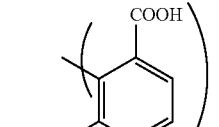
(1-38)
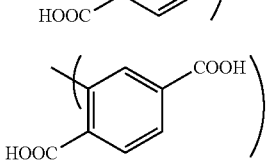
(1-39)
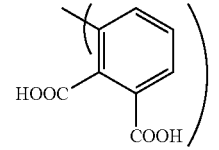

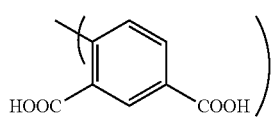
(1-40)
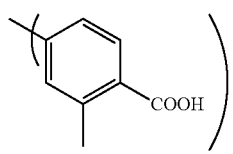
(1-41)
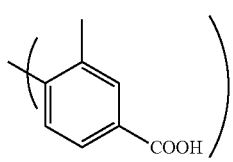
(1-42)
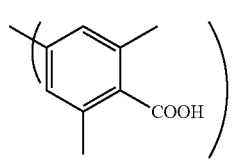
(1-43)
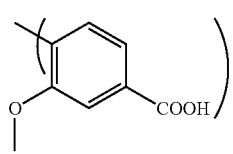
(1-44)
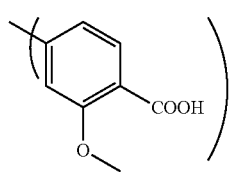
(1-45)
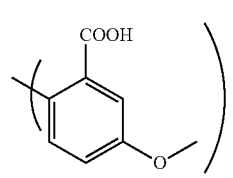
(1-46)
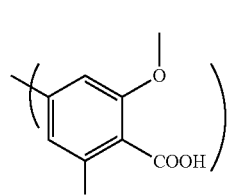
(1-47)
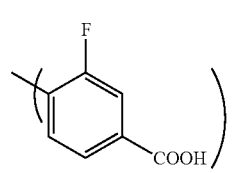
(1-48)
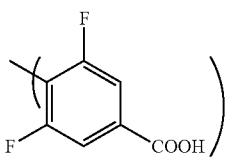
(1-49)
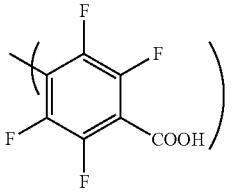
(1-50)
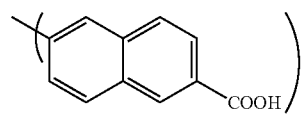
(1-51)
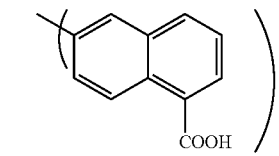
(1-52)
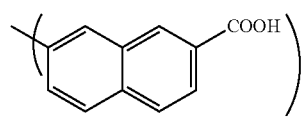
(1-53)
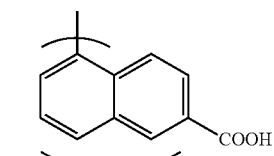
(1-54)
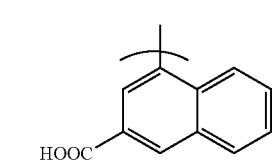
(1-55)
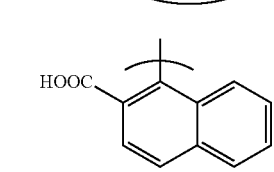
(1-56)
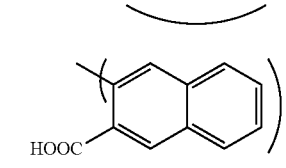
(1-57)
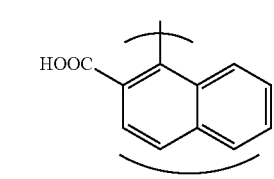
(1-58)

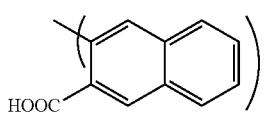 (1-59)
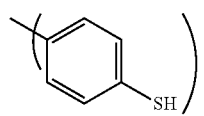 (1-60)
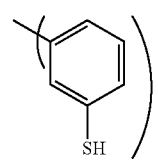 (1-61)
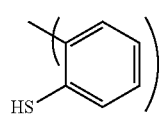 (1-62)
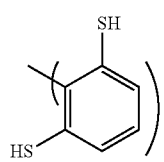 (1-63)
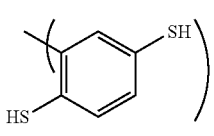 (1-64)
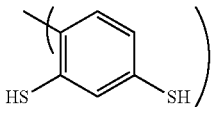 (1-65)
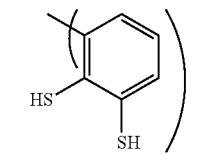 (1-66)
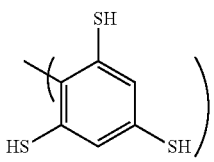 (1-67)
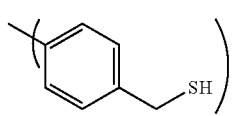 (1-68)
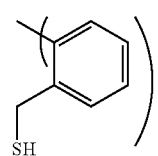 (1-69)
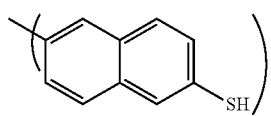 (1-70)
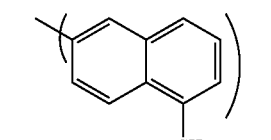 (1-71)
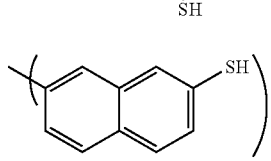 (1-72)
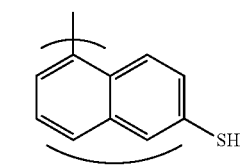 (1-73)
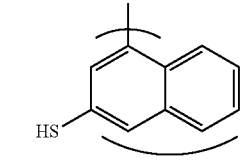 (1-74)
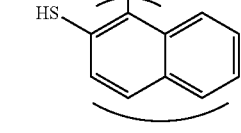 (1-75)
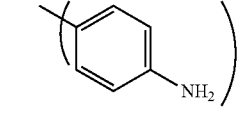 (1-76)
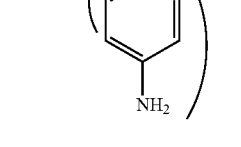 (1-77)
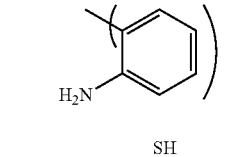 (1-78)
(1-79)

-continued
(1-80) 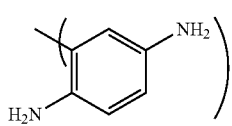
(1-81) 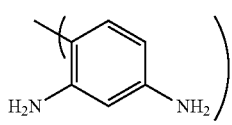
(1-82) 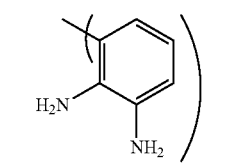
(1-83) 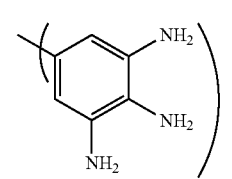
(1-84) 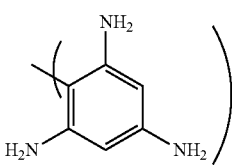
(1-85) 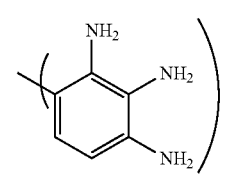
(1-86) 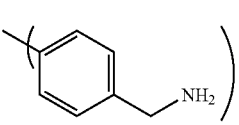
(1-87) 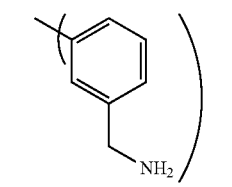
(1-88) 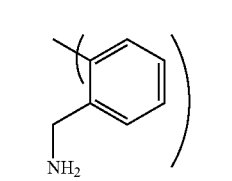
(1-89) 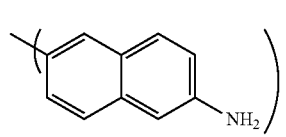
-continued
(1-90) 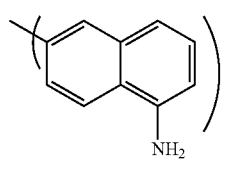
(1-91) 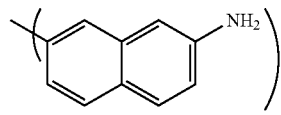
(1-92) 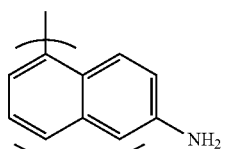
(1-93) 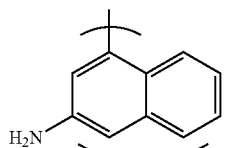
(1-94) 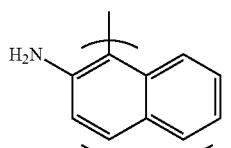
(1-95) 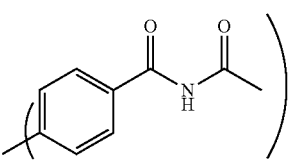
(1-96) 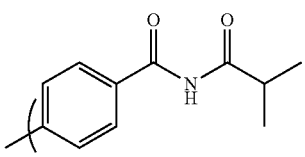
(1-97) 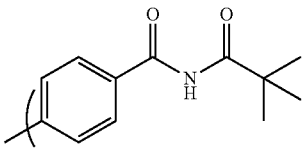
(1-98) 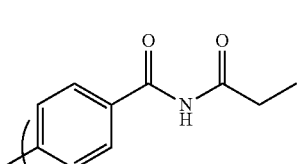

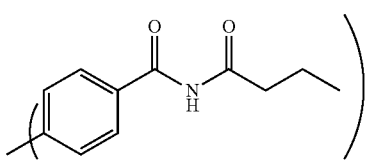
(1-99)
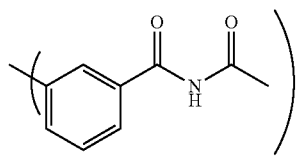
(1-100)
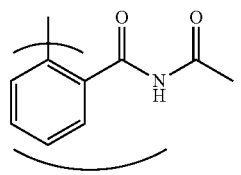
(1-101)
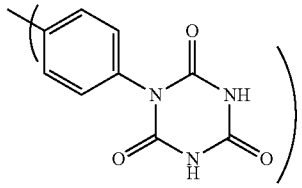
(1-102)
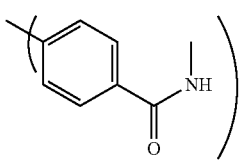
(1-103)
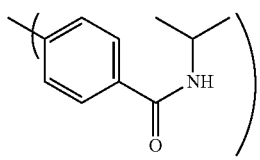
(1-104)
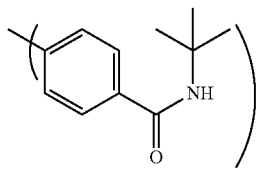
(1-105)
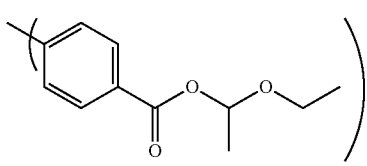
(1-106)
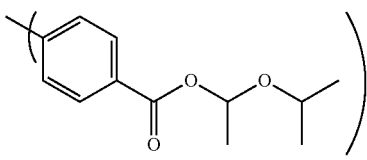
(1-107)
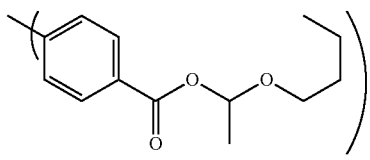
(1-108)
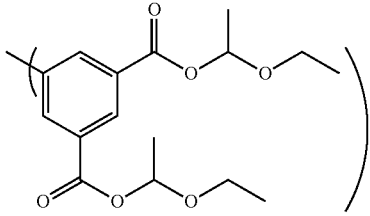
(1-109)
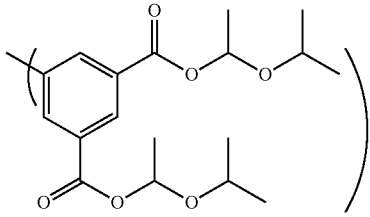
(1-110)
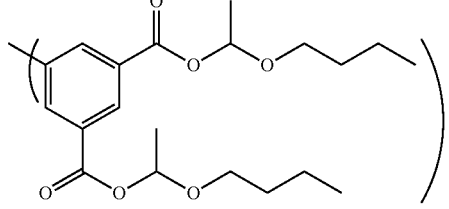
(1-111)
Examples of the group of Formula (2) include groups of the following Formulae (2-1) to (2-28).
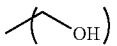
(2-1)
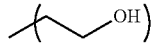
(2-2)
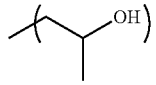
(2-3)
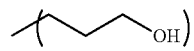
(2-4)
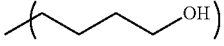
(2-5)
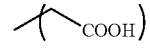
(2-6)
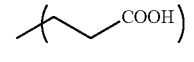
(2-7)
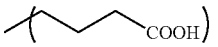
(2-8)
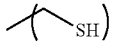
(2-9)

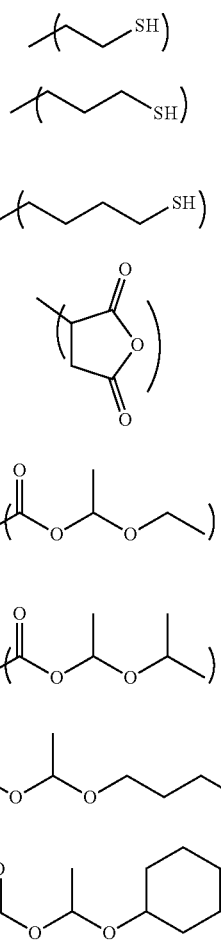

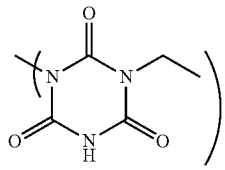
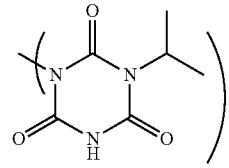
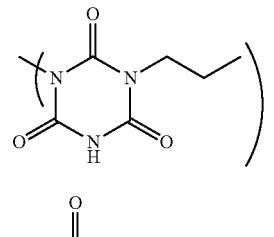
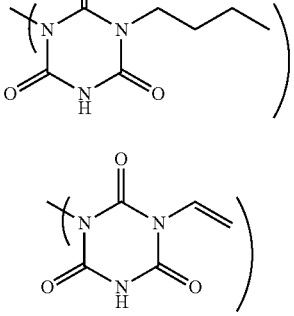

The compound having a weight average molecular weight of 800 or more may further have a light absorption portion that shows absorption at a wavelength of 193 nm or a light absorption portion that shows absorption at a wavelength of 248 nm. Examples of the light absorption portion that shows absorption at a wavelength of 193 nm include a benzene ring, a naphthalene ring, a triazine ring, and an isocyanurate ring. Examples of the light absorption portion that shows absorption at a wavelength of 248 nm include a naphthalene ring, an anthracene ring, and a triazine ring.

[Crosslinker]

The composition for forming a protective film of the present invention contains a crosslinker having, in one molecule, two or more groups that are at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group. The crosslinker may have, in one molecule, two or more groups that are one of the aforementioned groups, or a total of two groups that are two of the aforementioned groups.

Examples of the compound having, in one molecule, two or more groups that are at least one selected from the group consisting of a glycidyl group, a terminal epoxy group, an epoxycyclopentyl group, and an epoxycyclohexyl group include tris(2,3-epoxypropyl) isocyanurate, 1,4-butanediol diglycidyl ether, glycerol triglycidyl ether, diethylene glycol diglycidyl ether, diglycidyl 1,2-cyclohexanedicarboxylate, 1,2-epoxy-4-(epoxyethyl)cyclohexane, 4,4'-methylenebis

[N,N-bis(oxyranylmethyl)aniline], trimethylolpropane triglycidyl ether, bisphenol-A-diglycidyl ether, TEPIC (registered trademark)-L, TEPIC-SS, TEPIC-PAS B26L, TEPIC-PAS B22, TEPIC-VL, and TEPIC-UC available from Nissan Chemical Industries, Ltd., EPOFRIEND AT501 and CT301, CELLOXIDE (registered trademark) 2021, 2081, and 8000, and EPOLEAD (registered trademark) GT-401, PB3600, PB4700, EHPE3150, and EHPE3150CE available from Daicel Corporation, 152, 154, 157S70, 168V70, 604, 630, 801N, 801PN, 802, 806, 807, 811, 813, 816A, 816C, 819, 825, 827, 828, 828EL, 828US, 828XA, 834X90, 871, 872, 1001, 1002, 1003, 1004, 1007, 1009, 1010, 1031S, 1032H60, 1256, 4004P, 4005P, 4007P, 4010P, 4250, 4275, 5046B80, YL980, YL983U, YL6810, YL6121L, YX4000, YX4000H, YX8000, YX8034, and YX8800 available from Mitsubishi Chemical Corporation, NC-3000, NC-3000-L, NC-3000-H, NC-3000-FH-75M, NC-3100, CER-3000-L, NC-2000-L, XD-1000, NC-7000L, NC-7300L, EPPN-501H, EPPN-501HY, EPPN-502H, EOCN-1020, EOCN-1025, EOCN-103S, EOCN-104S, CER-1020, EPPN201, BREN-S, BREN-105, GAN, GOT, RE-3035-L, and RE-310S available from NIPPON KAYAKU Co., Ltd., Denacol (registered trademark) EX-211, EX-212, EX-252, EX-810, EX-811, EX-850, EX-851, EX-821, EX-830, EX-832, EX-841, EX-861, EX-911, EX-941, EX-920, EX-931, EX-313, EX-314, EX-321, EX-411, EX-421, EX-512, EX-612, and EX-614 available from Nagase ChemteX Corporation, CY175, CY177, CY179, CY182, CY184, and CY192 available from BASF Japan Ltd., EPICLON 840, 804-S, 850, 850-S, 850-CRP, 850-LC, 860, 1050, 1055, 3050, 4050, 7050, AM-020-P, AM-040-P, HM-091, HM-101, 830, 830-S, EXA-830LVP, 835, EXA-835LV, 1051-75M, 7070-40K, HM-091-40AX, 152, 153, 153-60T, 153-60M, 1121N-80M, 1123P-75M, N-660, N-665, N-670, N-673, N-680, N-695, N-655-EXP-S, N-662-EXP-S, N-665-EXP, N-672-EXP, N-670-EXP-S, N-685-EXP-S, N-673-80M, N-680-75M, N-690-75M, N-740, N-770, N-775, N-865, HP-4032, HP-4032D, HP-4700, HP-4710, HP-4770, HP-5000, HP-7200, HP-7200H, HP-820, 5500, and 5800 available from DIC Corporation, MA-DGIC, DAG-G, and TG-G available from Shikoku Chemicals Corporation, and EpoTohto (registered trademark) YD-127, YD-128, YDF-170, YD-8125, YDF-8170C, ZX-1059, YD-825GS, YD-825GSH, YDF-870GS, YDPN-138, YDCN-700, YDC-1312, YSLV-80XY, YSLV-120TE, ST-3000, ST-4000D, YD-171, YH-434, YH-434L, FX-289BEK75, FX-305EK70, and ERF-001M30 available from NIPPON STEEL & SUMIKIN CHEMICAL CO., LTD.

In addition, as the compound having, in one molecule, two or more groups that are at least one selected from the group consisting of a glycidyl group, a terminal epoxy group, an epoxycyclopentyl group, and an epoxycyclohexyl group, a polymer may be used. The polymer may be used without particular limitation as long as it is a polymer having, in one molecule, two or more groups that are at least one selected from the group consisting of a glycidyl group, a terminal epoxy group, an epoxycyclopentyl group, and an epoxycyclohexyl group. Such a polymer can be produced by addition polymerization of an addition-polymerizable monomer having an epoxy group or by a reaction of a polymer having a hydroxy group with a compound having an epoxy group such as epichlorohydrin and glycidyl tosylate. Examples of the polymer include an addition-polymerized polymer such as polyglycidyl acrylate, a copolymer of glycidyl methacrylate with ethyl methacrylate, and a copolymer of glycidyl methacrylate, styrene, and 2-hydroxyethyl methacrylate, and a condensation-polymerized polymer such as epoxy novolac. The weight average molecular weight of the polymer is, for example, 1,000 to 200,000.

Examples of the compound having two or more oxetanyl groups in one molecule include (7-oxabicyclo[4.1.0]heptan)-3-yl methyl 7-oxabicyclo[4.1.0]heptane-3-carboxylate, and ARONE OXETANE (registered trademark) OXT-121 and OXT-221 available from TOAGOSEI CO., LTD.

As the compound having two or more oxetanyl groups in one molecule, a polymer may be used. The polymer may be used without particular limitation as long as it is a polymer having two or more oxetanyl groups in one molecule. Such a polymer can be produced by addition polymerization of an addition-polymerizable monomer having an oxetanyl group. The weight average molecular weight of the polymer is, for example, 1,000 to 200,000.

Examples of the compound having two or more vinyl ether groups in one molecule include 1,3,5-tris(4-vinyloxybutyl)trimellitate and bis(4-vinyloxybutyl)isophthalate.

As the compound having two or more vinyl ether groups in one molecule, a polymer may be used. The polymer may be used without particular limitation as long as it is a polymer having two or more vinyl ether groups in one molecule. Such a polymer can be produced by addition polymerization of an addition-polymerizable monomer having a vinyl ether group. The weight average molecular weight of the polymer is, for example, 1,000 to 200,000.

Examples of the compound having two or more isocyanate groups in one molecule include BURNOCK (registered trademark) D-750, D-800, DN-920, DN-950, DN-955, DN-980, and DN-981 available from DIC Corporation, and TAKENATE (registered trademark) 500, 600, D-110N, D-120N, D-140N, D-165N, D-170N, and D-177N available from Mitsui Chemicals, Inc.

As the compound having two or more isocyanate groups in one molecule, a polymer may be used. The polymer may be used without particular limitation as long as it is a polymer having two or more isocyanate groups in one molecule. Such a polymer can be produced by addition polymerization of an addition-polymerizable monomer having an isocyanate group. The weight average molecular weight of the polymer is, for example, 1,000 to 200,000.

Examples of the compound having two or more blocked isocyanate groups in one molecule include TAKENATE (registered trademark) B-815N, B-830, B-842N, B-870N, B-874N, B-882N, B-7005, B-7030, B-7075, and B-5010 available from Mitsui Chemicals, Inc., VESTAGON (registered trademark) B1065, B1400, and B1530 available from Evonik Industries AG, and VESTANAT (registered trademark) B1358/100, B1370, EP-DS1076, and EP-DS1205 available from Evonik Industries AG.

As the compound having two or more blocked isocyanate groups in one molecule, a polymer may be used. The polymer may be used without particular limitation as long as it is a polymer having two or more blocked isocyanate groups in one molecule. Such a polymer can be produced by addition polymerization of an addition-polymerizable monomer having a blocked isocyanate group. The weight average molecular weight of the polymer is, for example, 1,000 to 200,000.

For example, the amount of the crosslinker to be added is an amount capable of sealing the substituent $X^1$ in an amount of 20% by mole to 150% by mole, preferably 40% by mole to 140% by mole, and more preferably 60% by mole to 120% by mole when the total amount of the substituent $X^1$ reacting with the crosslinker in the compound having a weight average molecular weight of 800 or more is made 100% by mole. When the content of the crosslinker in the composition for forming a protective film of the present invention is too small or too large, the resistance to a resist solvent or a basic aqueous hydrogen peroxide solution of a protective film to be formed may be insufficiently achieved.

[Crosslinking Catalyst]

The composition for forming a protective film of the present invention may contain a crosslinking catalyst as an optional component to promote a crosslinking reaction. As the crosslinking catalyst, an acidic compound, a basic compound, or a compound generating an acid or a base by heat may be used. As the acidic compound, a sulfonic acid compound or a carboxylic acid compound may be used. As the compound generating an acid by heat, a thermal acid generator may be used.

Examples of the sulfonic acid compound or carboxylic acid compound include p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, pyridinium-4-hydroxybenzenesulfonic acid, benzenedisulfonic acid, 1-naphthalenesulfonic acid, 4-nitrobenzenesulfonic acid, citric acid, benzoic acid, and hydroxybenzoic acid.

Examples of the thermal acid generator include K-PURE (registered trademark) CXC-1612, CXC-1614, TAG-2172, TAG-2179, TAG-2678, and TAG2689 (all available from King Industries, Inc.), and SI-45, SI-60, SI-80, SI-100, SI-110, and SI-150 (all available from SANSHIN CHEMICAL INDUSTRY CO., LTD.).

One or two or more kinds of the crosslinking catalyst may be used in combination. As the basic compound, an amine compound or an ammonium hydroxide compound may be used. As the compound generating a base by heat, urea may be used.

Examples of the amine compound include tertiary amines such as triethanolamine, tributanolamine, trimethylamine, triethylamine, tri-n-propylamine, triisopropylamine, tri-n-butylamine, tri-tert-butylamine, tri-n-octylamine, triisopropanolamine, phenyldiethanolamine, stearyldiethanolamine, and diazabicyclooctane, and aromatic amines such as pyridine and 4-dimethylaminopyridine. Additional examples of the amine compound include primary amines such as benzylamine and n-butylamine, and secondary amines such as diethylamine and di-n-butylamine. The amine compound may be used alone or two or more kinds thereof may be used in combination.

Examples of the ammonium hydroxide compound include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide.

As the compound generating a base by heat, for example, a compound that has a thermally unstable group such as an amido group, a urethane group, and an aziridine group and produces amine by heating may be used. Additional examples of the compound generating a base by heat include urea, benzyltrimethylammonium chloride, benzyltriethylammonium chloride, benzyldimethylphenylammonium chloride, benzyldodecyldimethylammonium chloride, benzyltributylammonium chloride, and choline chloride.

When the composition for forming a protective film contains the crosslinking catalyst, the content of the crosslinking catalyst is, for example, 0.2% by mass to 20% by mass relative to the content of the compound having a weight average molecular weight of 800 or more in the composition for forming a protective film.

[Other Component]

The composition for forming a protective film of the present invention may contain a surfactant as an optional component to improve application properties to a semiconductor substrate. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop (registered trademark) EF301, EF303, and EF352 (available from Mitsubishi Materials Electronic Chemicals Co., Ltd.), MEGAFACE (registered trademark) F171, F173, R-30, R-30N, R-40, and R-40-LM (available from DIC Corporation), Fluorad FC430 and FC431 (available from Sumitomo 3M, Ltd.), AsahiGuard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin-Etsu Chemical Co., Ltd.). The surfactant may be used alone or two or more kinds thereof may be used in combination. When the composition for forming a protective film contains the surfactant, the content of the surfactant is, for example, 0.01% by mass to 10% by mass relative to the content of the compound having a weight average molecular weight of 800 or more in the composition for forming a protective film.

The composition for forming a protective film of the present invention can be prepared by dissolving the components in an organic solvent. The composition for forming a protective film can be used in a homogeneous solution state. Examples of the organic solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. The solvent may be used alone or two or more kinds thereof may be used in combination.

It is preferable that the prepared composition for forming a protective film be used after filtration through a filter having a pore diameter of 0.2 μm or 0.1 μm and/or a filter having a pore diameter of 0.01 μM.

Hereinafter, a method for forming a pattern using the composition for forming a protective film of the present invention will be described.

Examples of a semiconductor substrate to be coated with the composition for forming a protective film of the present invention include a silicon wafer, a germanium wafer, and compound semiconductor wafers of gallium arsenide, indium phosphide, gallium nitride, indium nitride, and aluminum nitride.

In a case of using a semiconductor substrate having an inorganic film on the surface, the inorganic film is formed, for example, by an atomic layer deposition (ALD) process, a chemical vapor deposition (CVD) process, a reactive sputtering process, an ion plating process, a vacuum vapor deposition process, or a spin coating process (spin on glass: SOG). Examples of the inorganic film include a polysilicon film, a silicon oxide film, a silicon nitride film, a borophospho silicate glass (BPSG) film, a titanium nitride film, a titanium oxide nitride film, a tungsten film, a gallium nitride film, and a gallium arsenide film.

To such a semiconductor substrate, the composition for forming a protective film of the present invention is applied by an appropriate coating process such as a spinner and a coater. The composition for forming a protective film is then baked by a heating means such as a hot plate to form a protective film. A baking condition is appropriately selected from a baking temperature of 100° C. to 400° C. and a baking time of 0.3 minutes to 60 minutes. The baking temperature is preferably 120° C. to 350° C., and more preferably 150° C. to 300° C., and the baking time is preferably 0.5 minutes to 30 minutes, and more preferably 0.8 minutes to 10 minutes. The thickness of the protective film to be formed is, for example, 0.001 μm to 10 μm, preferably 0.002 μm to 1 μm, and more preferably 0.005 μm to 0.5 μm. When the baking temperature is lower than the aforementioned range, crosslinking is insufficient, and the resistance to a resist solvent or a basic aqueous hydrogen peroxide solution of the protective film may be insufficiently obtained. When the baking temperature is higher than the aforementioned range, the protective film may be decomposed by heat.

Subsequently, a resist pattern is formed on the protective film. The resist pattern is formed by a general method, that is, by applying a photoresist solution to the protective film, prebaking, exposure, post exposure bake abbreviated to PEB (if necessary), development, and rinsing. The photoresist solution used to form the resist pattern is not particularly limited as long as it can be sensitive to light used in exposure. A positive photoresist solution may be used. Examples thereof include a chemically amplified photoresist including a binder having a group that is decomposed by an acid to increase the alkali dissolution rate, and a photoacid generator, a chemically amplified photoresist including a low-molecular-weight compound that is decomposed by an acid to increase the alkali dissolution rate of the photoresist, an alkali-soluble binder, and a photoacid generator, a chemically amplified photoresist including a binder having a group that is decomposed by an acid to increase the alkali dissolution rate, a low-molecular-weight compound that is decomposed by an acid to increase the alkali dissolution rate of the photoresist, and a photoacid generator, and a DNQ-novolac-type non-chemically amplified photoresist using a difference between the alkali dissolution rate in an exposed area and that in a non-exposed area. Examples thereof include trade name PAR710 available from Sumitomo Chemical Co., Ltd., trade name TDUR-P3435LP and THMR-iP1800 available from TOKYO OHKA KOGYO CO., LTD., and trade name SEPR430 available from Shin-Etsu Chemical Co., Ltd. Instead of the positive photoresist, a negative photoresist may be used.

The exposure is carried out through a mask (reticle) for forming a predetermined pattern. For example, an i line, a KrF excimer laser, an ArF excimer laser, extreme ultraviolet light (EUV), or an electron beam (EB) can be used in the exposure. In the development, an alkaline developer is used. The development temperature is appropriately selected from 5° C. to 50° C. and the development time is appropriately selected from 10 seconds to 300 seconds. Examples of the alkaline developer include alkaline aqueous solutions including an aqueous solution of an alkali metal hydroxide such as potassium hydroxide and sodium hydroxide, an aqueous solution of a quaternary ammonium hydroxide such as tetramethylammonium hydroxide, tetraethylammonium hydroxide, and choline, and an aqueous solution of an amine such as ethanolamine, propylamine, and ethylenediamine. Further, a surfactant or the like can be added to the developer. A method for developing a portion where the alkali dissolution rate of the photoresist is not improved by using an organic solvent such as butyl acetate instead of the alkaline developer may be used.

Subsequently, the protective film is dry etched using the formed resist pattern as a mask. When the inorganic film is formed on the surface of the semiconductor substrate used, the surface of the inorganic film is exposed. When the inorganic film is not formed on the surface of the semiconductor substrate used, the surface of the semiconductor substrate is exposed.

Further, the semiconductor substrate is wet-etched with a basic aqueous hydrogen peroxide solution using the dry-etched protective film (including the resist pattern when the resist pattern remains on the protective film) as a mask. As a result, a desired pattern is formed. Examples of a chemical solution for wet etching include a basic aqueous hydrogen peroxide solution in which a substance exhibiting basicity such as ammonia, sodium hydroxide, potassium hydroxide, sodium cyanide, potassium cyanide, and an organic amine such as triethanol amine is mixed with a hydrogen peroxide solution, to make the pH basic. As the chemical solution for wet etching, a substance making the pH basic, for example, a substance in which urea is mixed with a hydrogen peroxide solution, thermal decomposition of urea is caused by heating, to produce ammonia, and the pH is finally made basicity may be used. The use temperature of the basic aqueous hydrogen peroxide solution is desirably 25° C. to 90° C., and further desirably 40° C. to 80° C. The wet etching time is desirably 0.5 minutes to 30 minutes, and further desirably 1 minute to 20 minutes.

EXAMPLES

An apparatus and the like used in measurement of weight average molecular weight of polymers obtained in the following Synthesis Examples will be described.
Apparatus: HLC-8220GPC manufactured by TOSOH CORPORATION
GPC column: Shodex (registered trademark) KF-803L, KF-802, and KF-801
Column temperature: 40° C.
Flow rate: 0.2 mL/min
Eluent: THF
Standard sample: polystyrene (TOSOH CORPORATION)

Hereinafter, the present invention will be described further specifically with reference to Examples. However, the present invention is not limited to Examples described below. As a basic aqueous hydrogen peroxide solution, chemical solutions of compositions shown in Tables 1 to 3 were used. However, the basic aqueous hydrogen peroxide solution applied to the present invention is not limited to the compositions.

Synthesis Example 1

40.60 g of propylene glycol was added to 100 g of solution having a solid content concentration of 10% by mass obtained by dissolving a p-vinylphenol monomer in propylene glycol (available from LANCASTER), and 25 g of methyl methacrylate (available from JUNSEI CHEMICAL CO., LTD.) was dissolved in the solution. Nitrogen was passed in the reaction solution for 30 minutes. While the reaction solution was kept to 70° C., 1.32 g of azobisisobutyronitrile (available from JUNSEI CHEMICAL CO., LTD.) dissolved in 40 g of propylene glycol was added, and the mixture was stirred in a nitrogen atmosphere. The reactant was precipitated in 1 L of distilled water, and the obtained precipitate was filtered and dried. As a result, a powder of a polymer having a structural unit of the following Formula (1A) was obtained. The obtained polymer was analyzed by GPC. The weight average molecular weight thereof in terms of standard polystyrene was about 5,000. The structure of the obtained polymer was a copolymer of p-vinyl phenol with methyl methacrylate at a ratio by mole of 25:75.

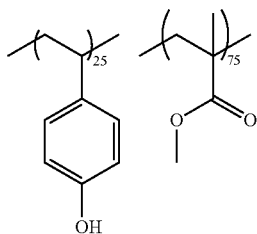

(1A)

Synthesis Example 2

A solution obtained by mixing 10 g of tris-(2,3-epoxypropyl)-isocyanurate (product name: TEPIC-SS available from Nissan Chemical Industries, Ltd.), 20.50 g of 3,7-dihydroxy-2-naphthoic acid (available from Tokyo Chemical Industry Co., Ltd.), 0.90 g of ethyltriphenylphosphonium bromide (available from ACROSS), and 73.27 g of propylene glycol monomethyl ether was heated to 120° C., and reacted for 24 hours in a nitrogen atmosphere. As a result, a solution containing a compound of the following Formula (1B) was obtained. The obtained solution containing the compound was analyzed by GPC. The weight average molecular weight thereof in terms of standard polystyrene was about 1,000.

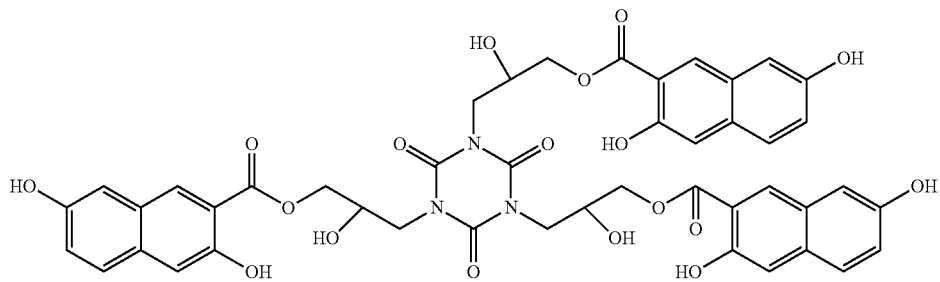

(1B)

Synthesis Example 3

A solution obtained by mixing 10 g of tris-(2,3-epoxypropyl)-isocyanurate (product name: TEPIC-SS available from Nissan Chemical Industries, Ltd.), 15.63 g of 2,5-dihydroxybenzoic acid (available from Tokyo Chemical Industry Co., Ltd.), 0.902 g of ethyltriphenylphosphonium bromide (available from ACROSS), and 61.90 g of propylene glycol monomethyl ether was heated to 120° C., and reacted for 24 hours in a nitrogen atmosphere. As a result, a solution containing a compound of the following Formula (1C) was obtained. The obtained solution containing the compound was analyzed by GPC. The weight average molecular weight thereof in terms of standard polystyrene was about 1,000.

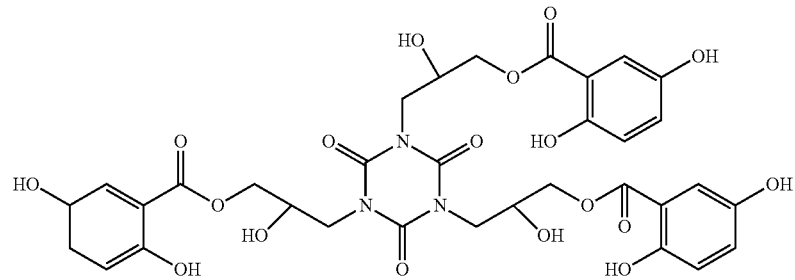

(1C)

Example 1

To 0.50 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, and 0.30 g of blocked isocyanate resin (trade name: VESTANAT (registered trademark) B1358/100 available from Evonik Japan Co., Ltd.) were added to obtain a solution. The solution was filtered through a polyethylene microfilter having a pore diameter of 0.02 μm, to prepare a composition for forming a protective film. The poly(p-hydroxystyrene) was analyzed by GPC. The weight average molecular weight thereof in terms of standard polystyrene was about 11,000.

Example 2

To 0.50 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, and 0.30 g of 1,3,5-tris(4-vinyloxybutyl)trimellitate were added to obtain a solution. The solution was filtered through a polyethylene microfilter having a pore diameter of 0.02 μm, to prepare a composition for forming a protective film.

Example 3

To 0.49 g of polyp-hydroxystyrene) (trade name: VP-8000 available from Nippon Soda Co., Ltd.), 11.52 g of propylene glycol monomethyl ether, 7.68 g of propylene glycol monomethyl ether acetate, 0.29 g of tetra(3,4-epoxycyclohexylmethyl) butanetetracarboxylate modified ε-caprolactone (trade name: EPOLEAD (registered trademark) GT-401 available from Daicel Corporation), and 0.01 g of pyridinium p-toluenesulfonate were added to obtain a solution. The solution was filtered through a polyethylene microfilter having a pore diameter of 0.02 μm, to prepare a composition for forming a protective film.

Example 4

To 0.60 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, 0.18 g of tris(4,5-epoxypentyl) isocyanurate (trade name: TEPIC (registered trademark)-VL available from Nissan Chemical Industries, Ltd.), and 0.02 g of pyridinium p-toluenesulfonate were added to obtain a solution. The solution was filtered through a polyethylene microfilter having a pore diameter of 0.02 μm, to prepare a composition for forming a protective film.

Example 5

To 0.33 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, and 0.47 g of 1,3,5-tris(4-vinyloxybutyl)trimellitate were added to obtain a solution. The solution was filtered through a polyethylene microfilter having a pore diameter of 0.02 μm, to prepare a composition for forming a protective film.

Example 6

To 0.43 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, and 0.37 g of EpoTohto (registered trademark) YH-434L available from NIPPON STEEL & SUMIKIN CHEMICAL CO., LTD., were added to obtain a solution. The solution was filtered through a polyethylene microfilter having a pore diameter of 0.02 μm, to prepare a composition for forming a protective film.

Example 7

To 0.45 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, and 0.35 g of TG-G available from Shikoku Chemicals Corporation were added to obtain a solution. The solution was filtered through a polyethylene microfilter having a pore diameter of 0.02 μm, to prepare a composition for forming a protective film.

Example 8

To 0.40 g of poly(p-hydroxystyrene) (trade name: VP-8000 available from Nippon Soda Co., Ltd.), 5.76 g of propylene glycol monomethyl ether, 13.44 g of propylene glycol monomethyl ether acetate, and 0.40 g of EpoTohto (registered trademark) YH-434L available from NIPPON STEEL & SUMIKIN CHEMICAL CO., LTD., were added to obtain a solution. The solution was filtered through a polyethylene microfilter having a pore diameter of 0.02 μm, to prepare a composition for forming a protective film.

Example 9

To 0.36 g of poly(p-hydroxystyrene) (trade name: VP-8000 available from Nippon Soda Co., Ltd.), 5.76 g of propylene glycol monomethyl ether, 13.44 g of propylene glycol monomethyl ether acetate, and 0.44 g of EpoTohto (registered trademark) YH-434L available from NIPPON STEEL & SUMIKIN CHEMICAL CO., LTD., were added to obtain a solution. The solution was filtered through a polyethylene microfilter having a pore diameter of 0.02 μm, to prepare a composition for forming a protective film.

Example 10

To 3.20 g of propylene glycol monomethyl ether solution containing 0.64 g of the polymer obtained in Synthesis Example 1, 3.20 g of propylene glycol monomethyl ether, 13.44 g of propylene glycol monomethyl ether acetate, and 0.16 g of EpoTohto (registered trademark) YH-434L available from NIPPON STEEL & SUMIKIN CHEMICAL CO., LTD., were added to obtain a solution. The solution was filtered through a polyethylene microfilter having a pore diameter of 0.02 μm, to prepare a composition for forming a protective film.

Example 11

To 3.08 g of propylene glycol monomethyl ether solution containing 0.62 g of the polymer obtained in Synthesis Example 1, 3.30 g of propylene glycol monomethyl ether, 13.44 g of propylene glycol monomethyl ether acetate, and 0.18 g of EpoTohto (registered trademark) YH-434L available from NIPPON STEEL & SUMIKIN CHEMICAL CO., LTD., were added to obtain a solution. The solution was filtered through a polyethylene microfilter having a pore diameter of 0.02 μm, to prepare a composition for forming a protective film.

Example 12

To 3.20 g of propylene glycol monomethyl ether solution containing 0.64 g of the polymer obtained in Synthesis Example 1, 3.20 g of propylene glycol monomethyl ether, 13.44 g of propylene glycol monomethyl ether acetate, and 0.16 g of TG-G available from Shikoku Chemicals Corporation were added to obtain a solution. The solution was filtered through a polyethylene microfilter having a pore diameter of 0.02 μm, to prepare a composition for forming a protective film.

Example 13

To 2.22 g of propylene glycol monomethyl ether solution containing 0.44 g of the compound obtained in Synthesis Example 2, 3.99 g of propylene glycol monomethyl ether, 13.44 g of propylene glycol monomethyl ether acetate, and 0.36 g of EpoTohto (registered trademark) YH-434L available from NIPPON STEEL & SUMIKIN CHEMICAL CO., LTD., were added to obtain a solution. The solution was filtered through a polyethylene microfilter having a pore diameter of 0.02 μm, to prepare a composition for forming a protective film.

Example 14

To 3.08 g of propylene glycol monomethyl ether solution containing 0.62 g of the compound obtained in Synthesis Example 2, 3.30 g of propylene glycol monomethyl ether, 13.44 g of propylene glycol monomethyl ether acetate, and 0.18 g of TG-G available from Shikoku Chemicals Corporation were added to obtain a solution. The solution was filtered through a polyethylene microfilter having a pore diameter of 0.02 μm, to prepare a composition for forming a protective film.

Example 15

To 2.50 g of propylene glycol monomethyl ether solution containing 0.50 g of the compound obtained in Synthesis Example 2, 3.76 g of propylene glycol monomethyl ether, 13.44 g of propylene glycol monomethyl ether acetate, and 0.30 g of TG-G available from Shikoku Chemicals Corporation were added to obtain a solution. The solution was filtered through a polyethylene microfilter having a pore diameter of 0.02 μm, to prepare a composition for forming a protective film.

Example 16

To 2.35 g of propylene glycol monomethyl ether solution containing 0.47 g of the compound obtained in Synthesis Example 2, 3.88 g of propylene glycol monomethyl ether, 13.44 g of propylene glycol monomethyl ether acetate, and 0.33 g of TG-G available from Shikoku Chemicals Corporation were added to obtain a solution. The solution was filtered through a polyethylene microfilter having a pore diameter of 0.02 μm, to prepare a composition for forming a protective film.

Example 17

To 2.22 g of propylene glycol monomethyl ether solution containing 0.44 g of the compound obtained in Synthesis Example 2, 3.98 g of propylene glycol monomethyl ether, 13.44 g of propylene glycol monomethyl ether acetate, and 0.36 g of TG-G available from Shikoku Chemicals Corporation were added to obtain a solution. The solution was filtered through a polyethylene microfilter having a pore diameter of 0.02 μm, to prepare a composition for forming a protective film.

Example 18

To 2.33 g of propylene glycol monomethyl ether solution containing 0.47 g of the compound obtained in Synthesis Example 3, 3.90 g of propylene glycol monomethyl ether, 13.44 g of propylene glycol monomethyl ether acetate, and 0.33 g of TG-G available from Shikoku Chemicals Corporation were added to obtain a solution. The solution was filtered through a polyethylene microfilter having a pore diameter of 0.02 μm, to prepare a composition for forming a protective film.

Comparative Example 1

To 0.60 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, 0.18 g of 1,3,4,6-tetrakis(methoxymethyl)glycoluril, and 0.02 g of pyridinium p-toluenesulfonate were added to obtain a solution. The solution was filtered through a polyethylene microfilter having a pore diameter of 0.02 μm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 2

To 0.49 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, 0.29 g of 1,3,4,6-tetrakis(methoxymethyl)glycoluril, and 0.01 g of pyridinium p-toluenesulfonate were added to obtain a solution. The solution was filtered through a polyethylene microfilter having a pore diameter of 0.02 μM, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 3

To 0.60 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, 0.18 g of 3,3',5,5'-tetrakis(methoxymethyl)-[1,1'-biphenyl]-4,4'-diol (trade name: TMOM-BP available from Honshu Chemical Industry Co., Ltd.), and 0.02 g of pyridinium p-toluenesulfonate were added to obtain a solution. The solution was filtered through a polyethylene microfilter having a pore diameter of 0.02

µm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 4

To 0.49 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, 0.29 g of 3,3',5,5'-tetrakis(methoxymethyl)-[1,1'-biphenyl]-4,4'-diol (trade name: TMOM-BP available from Honshu Chemical Industry Co., Ltd.), and 0.01 g of pyridinium p-toluenesulfonate were added to obtain a solution. The solution was filtered through a polyethylene microfilter having a pore diameter of 0.02 µm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 5

To 0.34 g of poly(p-hydroxystyrene) (trade name: VP-8000 available from Nippon Soda Co., Ltd.), 11.52 g of propylene glycol monomethyl ether, 7.68 g of propylene glycol monomethyl ether acetate, 0.45 g of 1,3,4,6-tetrakis(methoxymethyl)glycoluril, and 0.01 g of pyridinium p-toluenesulfonate were added to obtain a solution. The solution was filtered through a polyethylene microfilter having a pore diameter of 0.02 µm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 6

To 2.84 g of propylene glycol monomethyl ether solution containing 0.57 g of the polymer obtained in Synthesis Example 1, 3.49 g of propylene glycol monomethyl ether, 13.44 g of propylene glycol monomethyl ether acetate, 0.22 g of 1,3,4,6-tetrakis(methoxymethyl)glycoluril, and 0.02 g of pyridinium p-toluenesulfonate were added to obtain a solution. The solution was filtered through a polyethylene microfilter having a pore diameter of 0.02 µm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 7

To 2.81 g of propylene glycol monomethyl ether solution containing 0.56 g of the compound obtained in Synthesis Example 2, 3.51 g of propylene glycol monomethyl ether, 13.44 g of propylene glycol monomethyl ether acetate, 0.22 g of 1,3,4,6-tetrakis(methoxymethyl)glycoluril, and 0.02 g of pyridinium p-toluenesulfonate were added to obtain a solution. The solution was filtered through a polyethylene microfilter having a pore diameter of 0.02 µm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 8

To 2.20 g of propylene glycol monomethyl ether solution containing 0.44 g of the compound obtained in Synthesis Example 2, 4.00 g of propylene glycol monomethyl ether, 13.44 g of propylene glycol monomethyl ether acetate, 0.35 g of 1,3,4,6-tetrakis(methoxymethyl)glycoluril, and 0.01 g of pyridinium p-toluenesulfonate were added to obtain a solution. The solution was filtered through a polyethylene microfilter having a pore diameter of 0.02 µm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

Comparative Example 9

To 2.03 g of propylene glycol monomethyl ether solution containing 0.41 g of the compound obtained in Synthesis Example 3, 4.14 g of propylene glycol monomethyl ether, 13.44 g of propylene glycol monomethyl ether acetate, 0.38 g of 1,3,4,6-tetrakis(methoxymethyl)glycoluril, and 0.01 g of pyridinium p-toluenesulfonate were added to obtain a solution. The solution was filtered through a polyethylene microfilter having a pore diameter of 0.02 µm, to prepare a composition for forming a film. The composition for forming a film of this Comparative Example did not contain a crosslinker having, in one molecule, two or more groups that were at least one selected from the group consisting of a glycidyl group, a terminal epoxy group, an epoxycyclopentyl group, an epoxycyclohexyl group, an oxetanyl group, a vinyl ether group, an isocyanate group, and a blocked isocyanate group.

(Formation of Coating Film on Silicon Substrate)

The composition for forming a protective film prepared in each of Examples 1 to 7 and the composition for forming a film prepared in each of Comparative Examples 1 to 5 was applied to a silicon substrate by spin coating, and baked at 220° C. for 60 seconds, to prepare a coating film with a thickness of 100 nm.

(Formation of Coating Film on Titanium Nitride Film Formed on Silicon Substrate)

The composition for forming a protective film prepared in each of Examples 8 to 18 and the composition for forming a film prepared in each of Comparative Examples 5 to 9 was applied to a titanium nitride film with a thickness of 50 nm formed on a surface of a silicon substrate by spin coating, and baked at 260° C. for 60 seconds, to prepare a coating film with a thickness of 100 nm.

(Elution Test into Photoresist Solvent)

The coating film formed from the composition for forming a protective film prepared in each of Examples 1 to 7 on the silicon substrate by baking at 220° C. for 60 seconds, and the coating film formed from the composition for forming a protective film prepared in each of Examples 8 to 18 on the titanium nitride film by baking at 260° C. for 60 seconds were each immersed for 1 minute in OK73 thinner (mixture of propylene glycol monomethyl ether and propylene glycol monomethyl ether acetate, available from TOKYO OHKA KOGYO CO., LTD.) that was a solvent used in applying a photoresist. It was confirmed that the change in thickness of each of the coating films before and after the immersion was 5% or less. This revealed that as an upper layer of each of the coating films prepared in Examples 1 to 18, a resist can be layered.

(Elution Test into Resist Developer)

The coating film formed from the composition for forming a protective film prepared in each of Examples 1 to 7 on the silicon substrate by baking at 220° C. for 60 seconds, and the coating film formed from the composition for forming a protective film prepared in each of Examples 8 to 18 on the titanium nitride film by baking at 260° C. for 60 seconds were each immersed for 1 minute in NMD-3 (available from TOKYO OHKA KOGYO CO., LTD.) that was a developer used in development of a photoresist. It was confirmed that the change in thickness of each of the coating films before and after the immersion was 5% or less.

(Test of Resistance to Basic Aqueous Hydrogen Peroxide Solution of Coating Film on Silicon Substrate)

The coating film formed from the composition for forming a protective film prepared in each of Examples 1 to 7 and the composition for forming a protective film prepared in each of Comparative Examples 1 to 5 was immersed in a basic aqueous hydrogen peroxide solution of a composition shown in Table 1 at a temperature shown in 1 for a predetermined time shown in Table 1 (4 minutes, 8 minutes, 12 minutes). The coating film was then washed with water, and dried. The state of the coating film was visually observed. The results are shown in Table 2 described below. In Table 2, "□" means that peeling of the coating film in the immersion for 4 minutes is not observed, "○" means that peeling of the coating film in the immersion for 8 minutes is not observed, "⊚" means that peeling of the coating film in the immersion for 12 minutes is not observed, and "x" means that peeling of a part or all of the coating film in the immersion for 4 minutes is observed.

TABLE 1

| Composition of basic aqueous hydrogen peroxide solution and treatment temperature | | | |
|---|---|---|---|
| 28% by mass aqueous ammonia solution | 33% by mass aqueous hydrogen peroxide solution | Water | Temperature |
| 25 mL | 100 mL | 500 mL | 65° C. |

TABLE 2

| Resistance to basic aqueous hydrogen peroxide solution | |
|---|---|
| | Results of resistance test |
| Example 1 | □ |
| Example 2 | ○ |
| Example 3 | ⊚ |
| Example 4 | ⊚ |
| Example 5 | ⊚ |
| Example 6 | ⊚ |
| Example 7 | ⊚ |
| Comparative Example 1 | X |
| Comparative Example 2 | X |
| Comparative Example 3 | X |
| Comparative Example 4 | X |
| Comparative Example 5 | X |

As clear from the results of Table 2, the coating films formed from the compositions for forming a protective film prepared in Examples 1 to 7 showed sufficient resistance to the basic aqueous hydrogen peroxide solution. This revealed that the coating films can be a protective film against the basic aqueous hydrogen peroxide solution. In particular, the coating films formed from the compositions for forming a protective film prepared in Examples 3 to 7 have excellent resistance to the basic aqueous hydrogen peroxide solution. On the other hand, as clear from the results, the coating films for med from the composition for forming a film prepared in Comparative Examples 1 to 5 did not show resistance to the basic aqueous hydrogen peroxide solution. This revealed that the coating films cannot be a protective film against the basic aqueous hydrogen peroxide solution.

(Test of Resistance to Basic Aqueous Hydrogen Peroxide Solution of Coating Film on Titanium Nitride Film)

The coating film formed from the composition for forming a protective film prepared in each of Examples 8 to 18 and the composition for forming a protective film prepared in each of Comparative Examples 5 to 9 was immersed in a basic aqueous hydrogen peroxide solution of a composition shown in Table 3 at a temperature shown in Table 3 for a predetermined time shown in Table 3 (1 minute, 1.5 minutes, 2 minutes). The coating film was then washed with water, and dried. The state of the coating film was visually observed. The results are shown in Table 4 described below. In Table 4, "□" means that peeling of the coating film in the immersion for 1 minute is not observed, "○" means that peeling of the coating film in the immersion for 1.5 minutes is not observed, "⊚" means that peeling of the coating film in the immersion for 2 minutes is not observed, and "x" means that peeling of a part or all of the coating film in the immersion for 1 minute is observed.

TABLE 3

| Composition of basic aqueous hydrogen peroxide solution and treatment temperature | | | |
|---|---|---|---|
| 28% by mass aqueous ammonia solution | 33% by mass aqueous hydrogen peroxide solution | Water | Temperature |
| 25 mL | 100 mL | 500 mL | 70° C. |

TABLE 4

Resistance to basic aqueous hydrogen peroxide solution

| | Results of resistance test |
|---|---|
| Example 8 | □ |
| Example 9 | □ |
| Example 10 | ○ |
| Example 11 | ○ |
| Example 12 | ○ |
| Example 13 | ◉ |
| Example 14 | □ |
| Example 15 | ○ |
| Example 16 | ◉ |
| Example 17 | ○ |
| Example 18 | ○ |
| Comparative Example 5 | X |
| Comparative Example 6 | X |
| Comparative Example 7 | X |
| Comparative Example 8 | X |
| Comparative Example 9 | X |

As clear from the results of Table 4, the coating films formed from the compositions for forming a protective film prepared in Examples 8 to 18 showed sufficient resistance to the basic aqueous hydrogen peroxide solution. This revealed that the coating films can be a protective film against the basic aqueous hydrogen peroxide solution. In particular, the coating films formed from the compositions for forming a protective film prepared in Examples 13 to 16 have excellent resistance to the basic aqueous hydrogen peroxide solution. On the other hand, as clear from the results, the coating films formed from the composition for forming a film prepared in Comparative Examples 5 to 9 do not have resistance to the basic aqueous hydrogen peroxide solution. This revealed that the coating films cannot be a protective film against the basic aqueous hydrogen peroxide solution.

(Amount of Substituent Reacting with Crosslinker to be Sealed by Crosslinker, in Compound Having Weight Average Molecular Weight of 800 or More)

The amount of substituent reacting with the crosslinker (hereinafter referred to as substituent) to be sealed by the crosslinker, in a compound having a weight average molecular weight of 800 or more in the coating film formed from the composition for forming a protective film prepared in each of Examples 1 to 18 was calculated. When the crosslinker has an already known chemical structure, the amount was calculated by the following Expression (A), or when the crosslinker has an unknown chemical structure, the amount was calculated by the following Expression (B). The results are shown in Table 5 described below.

100×(the amount of crosslinker to be added to a compound having a weight average molecular weight of 800 or more (% by mass))/[{100/(the molecular weight of one unit structure in the compound having a weight average molecular weight of 800 or more)×(the number of substituent of one unit structure in the compound having a weight average molecular weight of 800 or more)}/(the number of crosslinking points in one molecule of the crosslinker)×(the molecular weight of the crosslinker)]    Expression (A):

100×(the amount of crosslinker to be added to a compound having a weight average molecular weight of 800 or more (% by mass))/[{100/(the molecular weight of one unit structure in the compound having a weight average molecular weight of 800 or more)×(the number of substituent of one unit structure in the compound having a weight average molecular weight of 800 or more)}×(the molecular weight of the crosslinker in one crosslinking point of the crosslinker)]    Expression (B):

TABLE 5

| | Amount of substituent to be sealed in compound having a weight average molecular weight of 800 or more |
|---|---|
| Example 1 | 21 |
| Example 2 | 43 |
| Example 3 | 36 |
| Example 4 | 28 |
| Example 5 | 100 |
| Example 6 | 100 |
| Example 7 | 100 |
| Example 8 | 114 |
| Example 9 | 137 |
| Example 10 | 100 |
| Example 11 | 119 |
| Example 12 | 115 |
| Example 13 | 116 |
| Example 14 | 50 |
| Example 15 | 100 |
| Example 16 | 116 |
| Example 17 | 132 |
| Example 18 | 100 |

The invention claimed is:

1. A composition for forming a protective film against basic aqueous hydrogen peroxide solution, comprising
a crosslinker having, in one molecule, two or more groups that are at least one selected from the group consisting of
a glycidyl group,
a terminal epoxy group,
an epoxycyclopentyl group,
an epoxycyclohexyl group,
an oxetanyl group,
a vinyl ether group,
an isocyanate group, and
a blocked isocyanate;
a compound having a group of the following Formula (1):

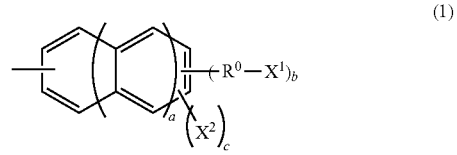

where
$X^1$ is a substituent reacting with the crosslinker,
$R^0$ is a direct bond or a $C_{1-2}$ alkylene group,
$X^2$ is a $C_{1-2}$ alkyl group, a $C_{1-2}$ alkoxy group, or fluoro group,
a is an integer of 0 to 2,
b is an integer of 1 to 3, when b is 2 or 3, groups of $-R^0-X^1$ are optionally different from each other,
c is an integer of 0 to 4, when c is 2, 3, or 4, the groups of $X^2$ are optionally different from each other, and
b and c satisfy a relational expression of $1 \leq (b+c) \leq 5$,
wherein the group of Formula (1) is on a side chain or a terminal of the compound, and the compound has a weight average molecular weight of 800 or more; and
an organic solvent.

2. A composition for forming a protective film against basic aqueous hydrogen peroxide solution, comprising
a crosslinker having, in one molecule, two or more groups that are at least one selected from the group consisting of
a glycidyl group,
a terminal epoxy group,
an epoxycyclopentyl group,
an epoxycyclohexyl group,
an oxetanyl group,
a vinyl ether group,
an isocyanate group, and
a blocked isocyanate group;
a compound having a group of the following Formula (2):

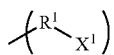  (2)

where
R$^1$ is a direct bond or a linear or branched alkylene group having a carbon atom number of 1 to 8, and
X$^1$ is a substituent reacting with the crosslinker, wherein the group of Formula (2) is on a side chain or a terminal of the compound, and the compound has a weight average molecular weight of 800 or more; and
an organic solvent.

3. The composition for forming a protective film against basic aqueous hydrogen peroxide solution according to claim 1, wherein the substituent X$^1$ reacting with the crosslinker is a group of the following Formula (3), (4), (5), (6), (7), (8), (9), (10), or (11):

—OH  (3)

—SH  (4)

—COOH  (5)

  (6)

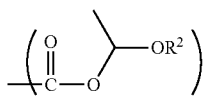  (7)

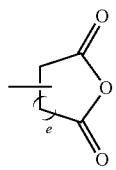  (8)

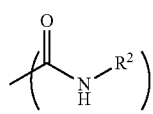  (9)

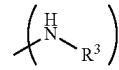  (10)

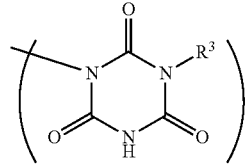  (11)

where
R$^2$ is a linear, branched, or cyclic alkyl group having a carbon atom number of 1 to 8,
R$^3$ is a hydrogen atom or a linear, branched, or cyclic hydrocarbon group having a carbon atom number of 1 to 8, and
e is 0 or 1.

4. The composition for forming a protective film against basic aqueous hydrogen peroxide solution according to claim 3, wherein the substituent X$^1$ reacting with the crosslinker is the group of Formula (3), (5), or (6).

5. The composition for forming a protective film against basic aqueous hydrogen peroxide solution according to claim 1, wherein the amount of the crosslinker to be added is an amount capable of sealing the substituent X$^1$ in an amount of 20% by mole to 150% by mole when the total amount of the substituent X$^1$ reacting with the crosslinker in the compound having a weight average molecular weight of 800 or more is made 100% by mole.

6. The composition for forming a protective film against basic aqueous hydrogen peroxide solution according to claim 1, wherein the crosslinker has two or more glycidyl groups, terminal epoxy groups, or epoxycyclohexyl groups in one molecule.

7. The composition for forming a protective film against basic aqueous hydrogen peroxide solution according to claim 1, wherein the blocked isocyanate group is a group of the following Formula (11) or (12):

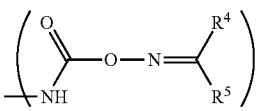  (11)

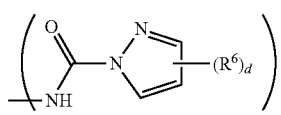  (12)

where
R$^4$ and R$^5$ are each independently a C$_{1-5}$ alkyl group,
R$^6$ is a C$_{1-5}$ alkyl group, d is an integer of 1 to 3, and when d is 2 or 3, C$_{1-5}$ alkyl groups of R$^6$ are optionally different from each other.

8. The composition for forming a protective film against basic aqueous hydrogen peroxide solution according to claim 1, further comprising a crosslinking catalyst.

9. The composition for forming a protective film against basic aqueous hydrogen peroxide solution according to claim 1, further comprising a surfactant.

10. A method for forming a pattern comprising: forming a protective film on a semiconductor substrate optionally having an inorganic film on a surface thereof using the composition for forming a protective film against basic aqueous hydrogen peroxide solution according to claim 1; forming a resist pattern on the protective film; dry etching the protective film using the resist pattern as a mask to expose the surface of the inorganic film or the semiconductor substrate; and wet etching the inorganic film or the semiconductor substrate with a basic aqueous hydrogen peroxide solution using the dry-etched protective film as a mask, followed by washing.

\* \* \* \* \*